United States Patent [19]
Werba

[11] Patent Number: 4,584,565
[45] Date of Patent: Apr. 22, 1986

[54] ANALOG/DIGITAL CONVERTER

[76] Inventor: Hans Werba, Theresienstrasse 11, D-8390 Passau, Fed. Rep. of Germany

[21] Appl. No.: 714,388

[22] Filed: Mar. 21, 1985

[30] Foreign Application Priority Data

Apr. 6, 1984 [DE] Fed. Rep. of Germany ....... 3413051

[51] Int. Cl.⁴ .......................................... H03K 13/02
[52] U.S. Cl. ............................................ 340/347 AD
[58] Field of Search .................... 340/347 AD, 347 M

[56] References Cited
U.S. PATENT DOCUMENTS 4,366,467 12/1982 Cushman ..................... 340/347 AD Primary Examiner—Vit W. Miska
Attorney, Agent, or Firm—Bacon & Thomas

[57] ABSTRACT

A/D converters in which a carrier frequency signal is frequency-modulated with the analog signal to be converted. The frequency-modulated signal is fed in parallel to a plurality of resonance means each of which is tuned to a different resonance frequency in the peak frequency deviation range. Depending on whether a resonator is in the resonance state or not, it is assigned a logical value "1" or a logical value "O". The logical value pattern corresponding to the resonance pattern of all resonators then represents the digitized instantaneous value of the analog signal.

16 Claims, 1 Drawing Figure

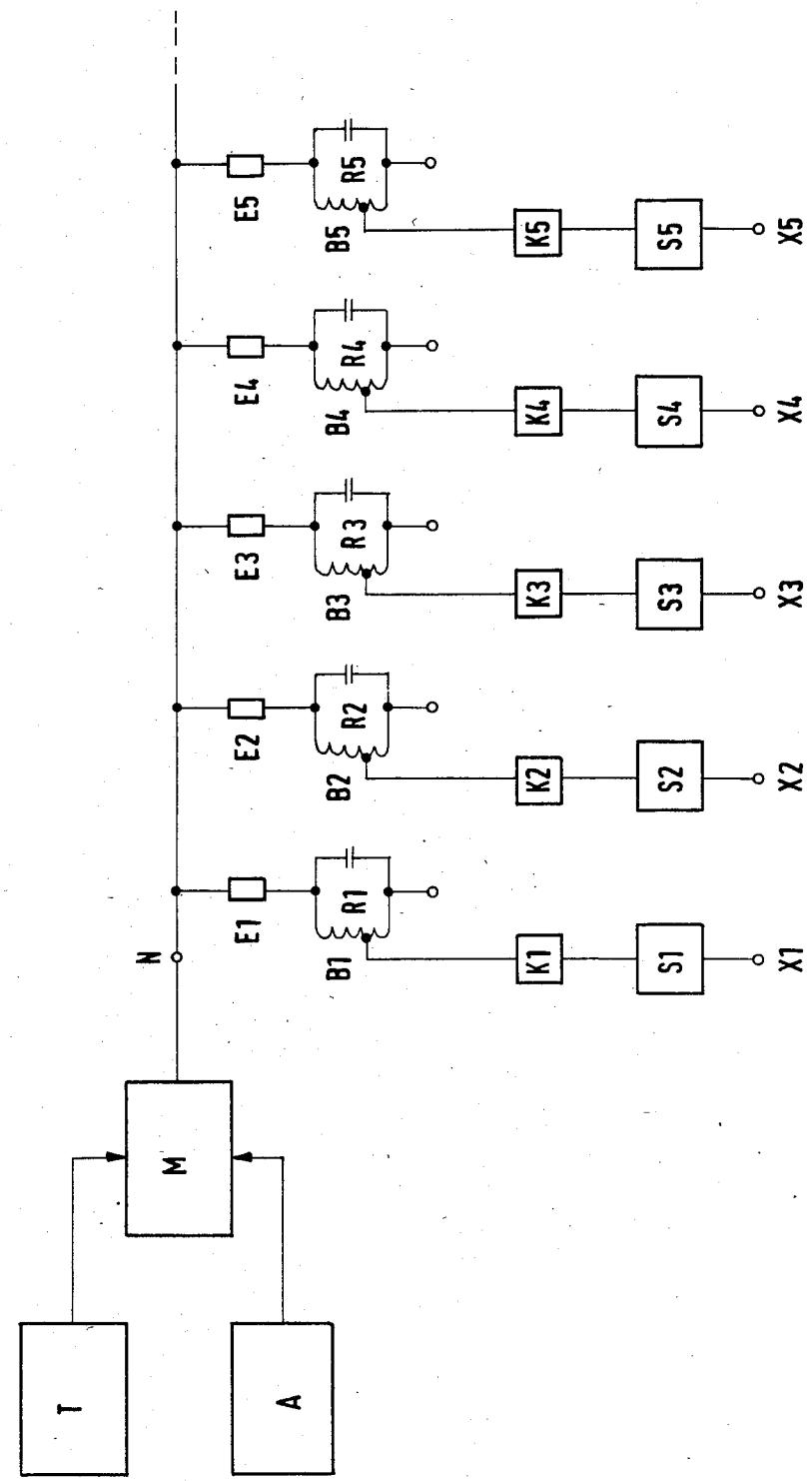

ANALOG/DIGITAL CONVERTER

The present invention relates to an analog/digital converter (referred to as an A/D converter in the following) according to the introductory part of claim 1.

Conventional A/D converters usually exhibit threshold circuits in the form of comparator circuits containing transistors which work in the cut-off region or in the saturation range, depending on whether the threshold is exceeded or not. Due to the time-delay effects involved in transistors which work in the saturation range at times, such A/D converters set limits on the maximum frequency of the analog signal to be digitized, which are often unacceptable.

Furthermore, the comparisons with thresholds of varying magnitudes are carried out successively in the case of such conventional A/D converters having comparator circuits. The analog signal to be converted is first compared with the largest stage. Comparisons with increasingly smaller thresholds then follow successively. Each of these stages can carry out its comparison with the corresponding threshold only when the comparison with the preceding larger threshold is terminated. As the quantization resolution increases during the analog/digital conversion, more time is required for a conversion process, so that the single A/D conversions can only be carried out at a relatively large time interval. This means that only analog signals having a relatively low frequency can be converted.

The invention is based on the problem of overcoming such disadvantages, in particular of arriving at an A/D converter which allows for conversion of analog signals having a relatively high frequency.

The solution to this problem is stated in claim 1 and may be developed advantageously according to the subclaims.

The inventive measure of not converting the analog signal directly but modulating it upon a carrier signal by means of frequency modulation and simultaneously offering the modulated signal to a number of resonance means having varying resonance frequencies, means that a digitized pattern is available simultaneously at the resonator means forming the outputs of the A/D converter immediately after the modulated signal is provided by the modulation means. The conversion repetition rate of the inventive A/D converter can be very high because conversion takes place in the parallel-working resonators virtually without any time-delay. Thus, analog signals having frequencies up to the GHZ range can be digitized.

The mode of operation of the inventive A/D converter becomes especially clear when it is compared with a tuned-reed frequency meter in which a signal whose frequency is initially unknown is offered to a comb having a plurality of reeds of varying lengths and capable of resonating, and the frequency can be detected on the basis of the particular vibrating reed.

In the case of the inventive A/D converter, the individual resonance means may be formed by individual resonators such as LC parallel or serial resonance circuits, $\lambda/4$ or $\lambda/2$ resonators, ceramic resonators, etc. The individual resonators may, however, also be formed by a plurality of interconnected resonators if particularly narrow-band resonance devices of high quality (Q-factor) are required in order to achieve a maximum degree of conversion accuracy.

Coupling links which guarantee good coupling to the modulation means on the one hand, and good decoupling between the individual resonance means, on the other hand, are preferably connected between the output of the modulation means and the inputs of the individual resonance means. Directional couplers, for example, are suitable for this purpose.

The binary pattern of the digitized signal is represented by the vibrational states of the individual resonator means. For example, the logical value "1" may be assigned to a resonance means in the resonance state and the logical value "zero" to a resonance means in the non-resonance state. The opposite assignment is of course also possible.

In a particularly preferred embodiment of the inventive A/D converter, each resonance means is followed by a threshold circuit by means of which the signal occurring at the corresponding resonance means is defined with respect to its meaning as the logical value "1" or the logical value "0".

The resonance means or the threshold circuits may each be connected with a stage of a memory which can take over and store the digital pattern defined by the particular states of the resonance means.

The inventive A/D converter may be used in an advantageous manner as a stepping switch which exhibits a plurality of switch outputs at which switching control signals can be generated at different times. The individual switch outputs are formed by the individual outputs of the A/D converter. To control the stepping switch, a switch output selection signal is applied to the modulation means as an analog signal, which leads to frequency modulation of the carrier signal to an instantaneous frequency to which the selected resonance means responds. When such a stepping switch is used as a programmable switch, the modulation means is fed a pattern of successive switch output selection signals predetermined by programming.

Such a stepping switch can be used, for example, for the variable control of multiplex systems, whereby the order of the successively actuated channels of the multiplex system may be varied by the program.

The invention and developments of the invention shall now be described in more detail with reference to an embodiment shown in the drawing.

In the embodiment shown in the FIGURE, a modulation means M is fed a carrier frequency from a carrier frequency signal source T, and an analog signal from an analog signal source A. In modulation means M the carrier frequency is frequency-modulated with the analog signal. In practical embodiments, the carrier frequency oscillator will preferably be modulated directly with the analog signal, so that the modulation means need not be designed as a separate circuit means.

A plurality of resonance means each formed in the embodiment shown by an LC parallel resonance circuit R1, R2, ... R5, is connected to output N of modulation means M. The number of resonators used depends on the desired resolution during the analog/digital conversion. In specific cases, more or fewer than five resonators may be used.

Each of these resonators is tuned to a different resonance frequency, although all these resonance frequencies are within the frequency deviation range used. A coupling link E1, E2, ... which assures good decoupling from the other resonators, on the one hand, and should allow for good coupling to the modulation means, on the other hand, is connected between each output connection N and the individual resonators R1, R2, .... Directional couplers are suitable, for example, but also other coupling links such as capacitors.

The inductance coils of the individual resonators R1, R2, ... exhibit tappings B1, B2, ... at which a signal may be picked up from which the resonance or non-resonance state of the particular resonator may be deduced. These tappings are followed in the preferred embodiment shown by threshold circuits S1, S2, ..., preferably via coupling out elements K1, K2, ... in order to prevent excessive load on the resonators and thus an excessive reduction of their quality. The selection of the response level of the threshold circuits defines in which ranges the resonator signal picked up at the particular tapping B1, B2, ... is to mean the logical value "0" or the logical value "1". Outputs X1, X2, ... of threshold circuits S1, S2, ... may be connected to the individual stages of a memory which receives the digital pattern obtained during the particular conversion and stores it until it is recalled for further use.

Depending on how high the quality of the resonators used is and how high the threshold of the threshold circuits is set, a logical value pattern can be obtained at the outputs of the A/D converter showing the logical value assigned to the resonance state at only one output or at a plurality of outputs located beside each other in terms of their frequencies. The position of this logical value occurring at only one resonator or at several resonators of adjacent frequencies then displays the instantaneous value of the converted analog signal in a coded manner.

A reduction in the number of necessary resonators may be achieved by making their resonance curves so wide that when the instantaneous frequency of the frequency-modulated carrier signal is between the resonance frequencies of two adjacent resonators, these two resonators assume a resonance state, but by making the resonance curves so narrow, on the other hand, that when the instantaneous frequency of the modulated carrier signal coincides with the resonance frequency of one of the resonators, only this one resonator goes into the resonance state. In this manner, two resonators may be used to represent three different analog signal values, for example, depending on whether two adjacent resonators both go into the resonance state or only one or only the other of these two resonators goes into this state.

In a preferred manner the high-frequency signal occurring at the particular tapping B1, B2, ... of the individual resonators R1, R2, ... may be rectified. This can be done using a diode which can simultaneously take over the function of the corresponding threshold circuit S1, S2, ....

The individual resonators may be connected with the output of modulator means M via a line, as schematically shown in the FIGURE. However, it is recommendable in particular at very high frequencies in order to avoid transit-time effects to connect all resonators in the manner of a star-connection to the output of the modulator means, whereby the connecting lines between the output of the modulator means and the individual resonators may be of equal length, in order to assure equal transittime effects. However, the lines to the individual resonators may also be given different lengths in accordance with their particular resonance frequency. By way of substitution or addition, coupling links E1, E2, ... may also be given different dimensions in accordance with the particular resonance frequencies of the individual resonators.

The invention thus makes a method of analog/digital conversion available in which a carrier frequency signal is frequency-modulated with the analog signal to be converted. The frequency-modulated signal is fed in parallel to a plurality of resonance means which are each tuned to a different resonance frequency in the peak frequency deviation range. Depending on whether a resonator is in the resonance state or not, it is assigned a logical value "1" or a logical value "0". The logical value pattern corresponding to the resonance pattern of all resonators then represents the digitized instantaneous value of the analog signal.

I claim:

1. An analog/digital converter having a carrier frequency source and a modulation means by means of which the carrier frequency signal is modulated with the analog signal to be converted, wherein the modulation means effects frequency modulation, the modulation means is followed by a plurality of parallel-fed resoncance means each having a different resonance frequency in the peak frequency deviation range and providing in the case of resonance a first binary logical value (e.g. "1") and in the case of non-resonance the other binary logical value (e.g. "0").

2. The analog/digital converter according to claim 1, wherein the individual resonance means are each formed by an LC parallel resonance circuit.

3. The analog/digital converter according to claim 1, wherein the individual resonance means are each formed by an LC series-resonant circuit.

4. The analog/digital converter according to claim 1, wherein the individual resonance means are each formed by an λ/4 line, with respect to the resonance frequency assigned to the particular resonance means.

5. The analog/digital converter according to claim 1, wherein the resonance means are eached formed by an λ/2 line, with respect to the resonance frequency assigned to the particular resonance means.

6. The analog/digital converter according to claim 1, wherein the individual resonance means are each formed by an λ/2 phasing line, λ/2 being with respect to a wavelength of the resonance frequency assigned to the particular resonance means.

7. The analog/digital converter according to claim 1, wherein each of the resonance means is formed by a ceramic resonator.

8. The analog/digital converter according to claim 1, wherein each resonance means is formed by a plurality of interconnected resonators.

9. The analog/digital converter according to claim 1, wherein the individual resonance means are coupled on the input side to the modulation means by means of a coupling link in each case, and are decoupled from one another by the same means.

10. The analog/digital converter according to claim 9, wherein a directional coupler is connected as a coupling link between the modulation means and each resonance means.

11. The analog/digital converter according to claim 1, wherein the coupling of the resonance means connected in parallel on the input side, to the output of the modulation means and the decoupling of the signals of the resonance means is effected in each case by an impedance, e.g. a resistor, an inductance and/or a capacitance.

12. The analog/digital converter according to claim 1, wherein a threshold circuit is connected to the output of each resonance means for the detection of the two possible binary logical values.

13. The analog/digital converter according to claim 12, wherein each threshold circuit is formed by a diode.

14. The analog/digital converter according to claim 12, wherein the inputs of individual stages of a memory for the converted digital pattern are connected to the outputs of the threshold circuits.

15. The analog/digital converter according to claim 1 wherein the outputs of the individual resonance means are arranged to form individual switch outputs, and wherein the modulation means is fed a switch output selection signal as an analog signal which effects modulation of the carrier signal to the resonance frequency assigned to the switch output selected in the particular case, whereby the analog/digital converter is useable as a controllable stepping switch.

16. The analog/digital converter according to claim 12, wherein the outputs of the individual threshold circuits are arranged to form individual switch outputs, and wherein the modulation means is fed a switch output selection signal as an analog signal which effects modulation of the carrier signal to the resonance frequency assigned to the switch output selected in the particular case whereby the analog/digital converter is useable as a controllable stepping switch.

* * * * *